(12) United States Patent
Suzuki et al.

(10) Patent No.: US 12,407,953 B2
(45) Date of Patent: Sep. 2, 2025

(54) IMAGING DEVICE

(71) Applicant: Sony Semiconductor Solutions Corporation, Kanagawa (JP)

(72) Inventors: Atsushi Suzuki, Kanagawa (JP); Takahiro Miura, Kanagawa (JP); Yoshinori Muramatsu, Kanagawa (JP); Shizunori Matsumoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 51 days.

(21) Appl. No.: 18/020,737

(22) PCT Filed: Sep. 28, 2021

(86) PCT No.: PCT/JP2021/035554
§ 371 (c)(1),
(2) Date: Feb. 10, 2023

(87) PCT Pub. No.: WO2022/075119
PCT Pub. Date: Apr. 14, 2022

(65) Prior Publication Data
US 2023/0300488 A1  Sep. 21, 2023

(30) Foreign Application Priority Data

Oct. 5, 2020  (JP) .................................. 2020-168249

(51) Int. Cl.
*H04N 25/75* (2023.01)
*H04N 25/771* (2023.01)
(Continued)

(52) U.S. Cl.
CPC ........... *H04N 25/75* (2023.01); *H04N 25/771* (2023.01); *H04N 25/772* (2023.01); *H04N 25/30* (2023.01)

(58) Field of Classification Search
CPC ........ H04N 25/00; H04N 25/30; H04N 25/57; H04N 25/59; H04N 25/616; H04N 25/75;
(Continued)

(56) References Cited

U.S. PATENT DOCUMENTS

2016/0104733 A1* 4/2016 Sato ...................... H04N 23/30
250/208.1
2019/0327439 A1  10/2019 Chen
2022/0166947 A1* 5/2022 Cotteleer ............... H04N 25/75

FOREIGN PATENT DOCUMENTS

EP  3709632 A1  9/2020
JP  2000165754 A  6/2000
(Continued)

OTHER PUBLICATIONS

International Search Report (PCT/ISA/210), International Application No. PCT/JP2021/035554, dated Dec. 7, 2021.
(Continued)

*Primary Examiner* — Lin Ye
*Assistant Examiner* — Chriss S Yoder, III
(74) *Attorney, Agent, or Firm* — Michael Best & Friedrich LLP

(57) ABSTRACT

Provided is an imaging device with low noise and a high dynamic range.
An imaging device includes: a conversion unit that converts an incident electromagnetic wave into a charge; a first capacitor that accumulates the charge when a voltage corresponding to the charge is equal to or lower than a predetermined threshold; a second capacitor that accumulates the charge when the voltage exceeds the threshold; a voltage conversion circuit that converts the charges accumulated in the first capacitor and the second capacitor into voltages; a first storage unit that stores a voltage corresponding to the accumulated charge in the first capacitor after a lapse of a first period since the first capacitor has started accumulating
(Continued)

the charge; and a second storage unit that stores a voltage corresponding to the accumulated charges in the first capacitor and the second capacitor after a lapse of a second period longer than the first period since the first capacitor has started accumulating the charge.

14 Claims, 11 Drawing Sheets

(51) Int. Cl.
  *H04N 25/772* (2023.01)
  *H04N 25/30* (2023.01)
(58) Field of Classification Search
  CPC .... H04N 25/771; H04N 25/772; H04N 25/78; H01L 27/144; H01L 27/14609; H01L 27/14634; H01L 27/14636; G01T 1/24
  See application file for complete search history.

(56) References Cited

FOREIGN PATENT DOCUMENTS

| | | |
|---|---|---|
| JP | 2002533691 A | 10/2002 |
| JP | 2012119349 A | 6/2012 |
| JP | 2013503325 A | 1/2013 |
| JP | 2014112760 A | 6/2014 |
| JP | 2015087242 A | 5/2015 |
| JP | 2016082255 A | 5/2016 |
| JP | 2020137102 A | 8/2020 |
| WO | 2013/073071 A1 | 5/2013 |

OTHER PUBLICATIONS

Japanese Office Action dated Mar. 18, 2025 for corresponding Japanese Application No. 2022-555380.

* cited by examiner

IMAGING DEVICE

TECHNICAL FIELD

The present disclosure relates to an imaging device.

BACKGROUND ART

In an imaging device that images an electromagnetic wave such as incident radiation, low noise performance, a high speed, and a high dynamic range are required. Patent Document 1 discloses an X-ray detector provided with an integration capacitor to perform reading of a signal and an integration operation of the integration capacitor in parallel. Patent Document 2 discloses a computer tomograph that determines a gain of a next frame on the basis of an output value in a current frame by using a fact that a variation between the frames is not large. Patent Document 3 discloses a radiation image pickup system in which a noise output line is added, and voltage values with a high conversion gain and a low conversion gain are stored in a pixel.

CITATION LIST

Patent Document

Patent Document 1: Japanese Patent Application Laid-Open No. 2013-503325
Patent Document 2: Japanese Patent Application Laid-Open No. 2002-533691
Patent Document 3: Japanese Patent Application Laid-Open No. 2016-82255

SUMMARY OF THE INVENTION

Problems to be Solved by the Invention

In the X-ray detector of Patent Document 1, the integration capacitor has a fixed capacitance, and is saturated at a high dose, and there is a problem that a dose of X-rays is not correctly detectable.

The tomograph of Patent Document 2 can switch a capacitance of the feedback capacitor, but it is difficult to cope with a sudden variation in an input signal because a feedback capacitance of the next frame is selected from the current output value. Furthermore, a feedback amplifier is used, and thus, there is a problem for a high-speed operation.

The radiation image pickup system of Patent Document 3 is provided with a selector switch for "wide", but a circuit is saturated so that a charge as a signal disappears if a high dose is input before switching the switch. Furthermore, there is a restriction on an exposure time period in one frame.

In view of the above problems of the related art, the present disclosure provides an imaging device with low noise, a high speed, and a high dynamic range.

Solutions to Problems

In order to solve the above problems, according to the present disclosure, there is provided an imaging device including:
a conversion unit that converts an incident electromagnetic wave into a charge;
a first capacitor that accumulates the charge when a voltage corresponding to the charge is equal to or lower than a predetermined threshold;
a second capacitor that accumulates the charge when the voltage exceeds the threshold;
a voltage conversion circuit that converts the charges accumulated in the first capacitor and the second capacitor into voltages;
a first storage unit that stores a voltage corresponding to the accumulated charge in the first capacitor after a lapse of a first period since the first capacitor has started accumulating the charge; and
a second storage unit that stores a voltage corresponding to the accumulated charges in the first capacitor and the second capacitor after a lapse of a second period longer than the first period since the first capacitor has started accumulating the charge.

A third storage unit that stores a voltage corresponding to the accumulated charge in the first capacitor after a lapse of the first period since the first capacitor has started accumulating the charge and
a fourth storage unit that stores a voltage corresponding to the accumulated charges in the first capacitor and the second capacitor after the lapse of the second period since the first capacitor has started accumulating the charge may be further provided
such that voltages stored in the third storage unit and the fourth storage unit in a frame period immediately before a predetermined frame period are output to a signal line while storing corresponding voltages respectively in the first storage unit and the second storage unit in the predetermined frame period, and
the voltages stored in the first storage unit and the second storage unit in the predetermined frame period are output to the signal line while storing corresponding voltages in the third storage unit and the fourth storage unit in a frame period immediately after the predetermined frame period.

A first reset circuit that discharges the accumulated charges in the first capacitor and the second capacitor for initialization and
a fifth storage unit that stores an initialization voltage when the first capacitor and the second capacitor are initialized may be further provided.

A first transfer circuit that outputs a differential voltage between the voltage stored in the second storage unit and the voltage stored in the fifth storage unit to a signal line every frame period may be further provided.

A sixth storage unit that stores a voltage of a path connected to the first reset circuit when the initialization by the first reset circuit is released may be further provided.

A second transfer circuit that outputs a differential voltage between the voltage stored in the first storage unit and the voltage stored in the sixth storage unit to a signal line every frame period may be further provided.

A first voltage limiter that blocks the accumulation of the charge in the second capacitor in a case where the voltage corresponding to the charge is equal to or lower than the threshold, and accumulates the charge in the second capacitor in a case where the voltage exceeds the threshold may be further provided.

A mode selection unit that selects whether to store a voltage corresponding to the accumulated charge of one of the first capacitor and the second capacitor in the second storage unit or to store a voltage corresponding to the accumulated charges of the first capacitor and the second capacitor in the second storage unit may be further provided.

A sample and hold circuit that samples and holds a voltage of a signal line that sequentially transfers the voltages stored in the first storage unit and the second storage unit at a predetermined cycle and an AD converter that converts the voltage sampled and held by the sample and hold circuit into a digital signal may be further provided.

A first holding circuit that holds one voltage out of the voltage stored in the first storage unit and the voltage stored in the second storage unit and a second holding circuit that holds another voltage out of the voltage stored in the first storage unit and the voltage stored in the second storage unit may be further provided.

A determination circuit that determines whether or not the accumulated charge in the first capacitor is saturated on the basis of digital signals held in the first holding circuit and the second holding circuit and a selection circuit that selects and outputs the digital signal held in the first holding circuit or the second holding circuit on the basis of a determination result of the determination circuit may be further provided.

The AD converter may include:
  a ramp wave selector that selects a first ramp wave voltage when the voltage held in the sample and hold circuit is equal to or higher than a predetermined reference voltage, and selects a second ramp wave voltage having a smaller change width of a voltage amplitude and a lower voltage change rate over time than the first ramp wave voltage when the voltage held in the sample and hold circuit is lower than the reference voltage;
  a comparison unit that compares the voltage held in the sample and hold circuit with the first ramp wave voltage or the second ramp wave voltage; and
  a counter that generates the digital signal on the basis of a comparison result of the comparison unit.

A plurality of pixel circuits connected to the signal line may be further provided
  such that the pixel circuit includes the conversion unit, the first capacitor, the second capacitor, the first storage unit, and the second storage unit, and
  the sample and hold circuit sequentially holds voltages output from the plurality of pixel circuits in one frame period.

A mode selection unit capable of selecting a predetermined mode for expanding a dynamic range may be further provided
  such that, when the predetermined mode is selected, in one frame period out of two successive frame periods, a length of the first period is shortened as compared with length of the first period in another frame period, and an amount of the accumulated charges of the first capacitor and the second capacitor stored in the second storage unit is limited.

In the one frame period, the accumulated charges in the first capacitor and the second capacitor may be temporarily discharged before the first period elapses and the second period elapses after the first capacitor and the second capacitor have started the charge accumulation, and thereafter, the accumulation of the charges may be resumed, and the second storage unit may store a voltage corresponding to accumulated charges after the first capacitor and the second capacitor resume the charge accumulation in the one frame period.

A mode selection unit capable of selecting a predetermined mode for expanding a dynamic range may be further provided
  such that, when the predetermined mode is selected, in one frame period out of two successive frame periods, a length of the first period is shortened as compared with length of the first period in another frame period, and an amount of the accumulated charges of the first capacitor and the second capacitor stored in the second storage unit and the fourth storage unit is limited.

In the one frame period, the accumulated charges in the first capacitor and the second capacitor may be temporarily discharged before the first period elapses and the second period elapses after the first capacitor and the second capacitor have started the charge accumulation, and thereafter, the accumulation of the charges may be resumed, and
  the fourth storage unit may store a voltage corresponding to accumulated charges after the first capacitor and the second capacitor resume the charge accumulation in the one frame period.

MODE FOR CARRYING OUT THE INVENTION

Hereinafter, embodiments of an imaging device will be described with reference to the drawings. Although the following description will be given focusing on main constituent portions of the imaging device will be mainly described, the imaging device may have constituent portions and functions that are not illustrated or described. The following description does not exclude the constituent portions or functions that are not illustrated or described.

First Embodiment

Figure 1:
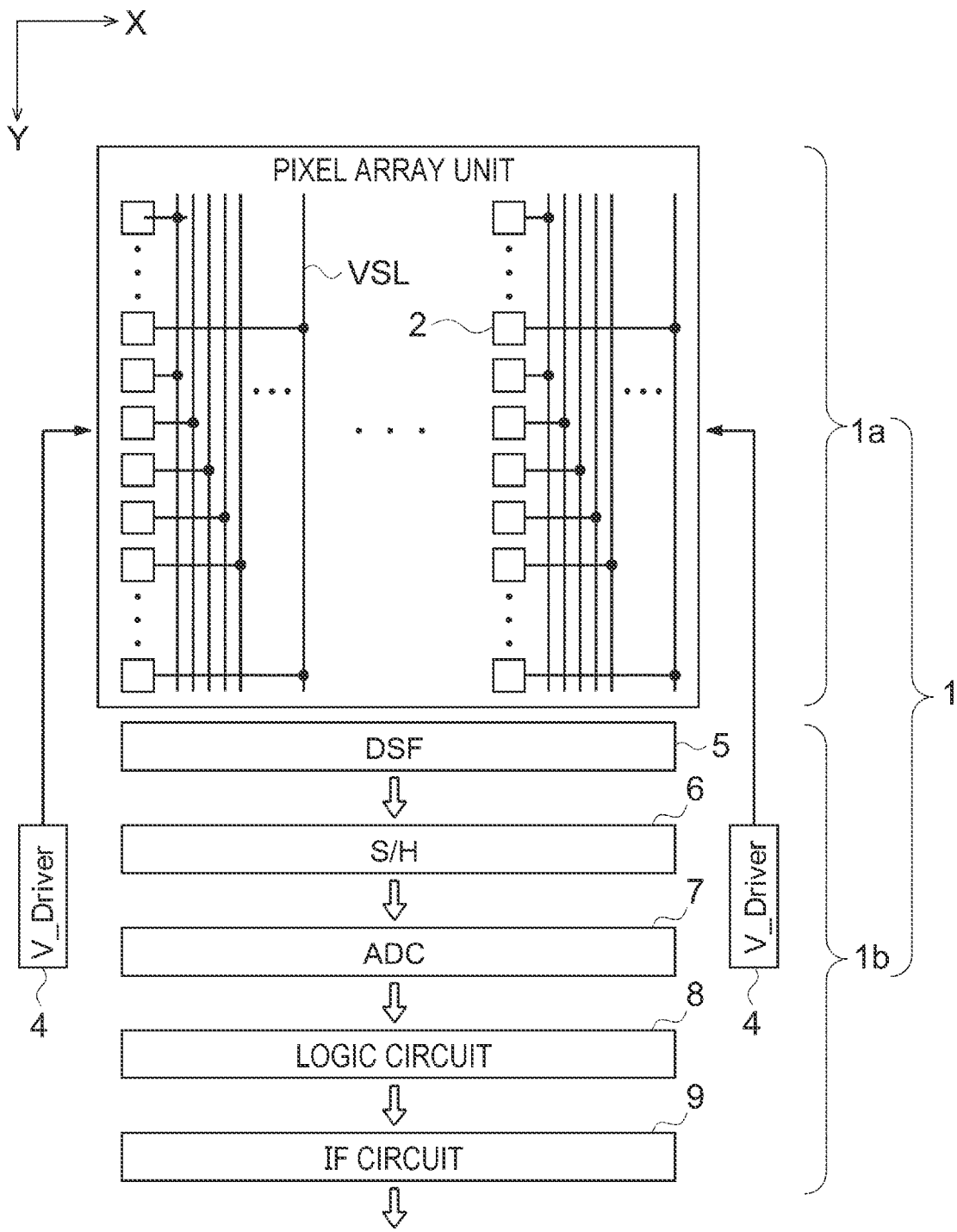
FIG. 1 is a block diagram illustrating a schematic configuration of an imaging device according to a first embodiment.

FIG. 1 is a block diagram illustrating a schematic configuration of an imaging device 1 according to a first embodiment. The imaging device 1 of FIG. 1 images an electromagnetic wave in a predetermined frequency band. Although the imaging device 1 (also referred to as an X-ray detection device) that detects an X-ray will be described as a specific example hereinafter, the present embodiment is also applicable to a frequency band other than X-rays.

The imaging device 1 of FIG. 1 includes a pixel array unit 1a and a peripheral circuit unit 1b. The pixel array unit 1a includes a plurality of pixel circuits 2 arranged in a horizontal direction X and a vertical direction Y, a plurality of signal lines VSL extending in the vertical direction Y, and a plurality of scanning lines (not illustrated) extending in the horizontal direction X. The peripheral circuit unit 1b includes a scanning line drive circuit (V_Driver) 4, a dummy source follower circuit (hereinafter, DSF circuit) 5, a sample and hold circuit (hereinafter, S/H circuit) 6, an analog-to-digital conversion circuit (hereinafter, ADC) 7, a logic circuit 8, and an interface circuit (IF circuit) 9.

In the imaging device 1 of FIG. 1, the number of the pixel circuits 2 and the number of the signal lines VSL are freely set. The pixel array unit 1a and the peripheral circuit unit 1b may be formed on the same substrate, or at least a part of the peripheral circuit unit 1b may be formed on a substrate different from a formation substrate of the pixel array unit 1a as described later.

The pixel circuit 2 includes a photodiode and a read circuit. Specific configurations and operations of the pixel circuit 2 will be described later. The plurality of pixel circuits 2 arranged in the vertical direction Y is connected to the plurality of signal lines VSL. More specifically, a plurality of the pixel circuits 2 arranged at intervals in the vertical direction is connected to one signal line VSL. Each of the signal lines VSL transfers an imaging signal imaged by the plurality of pixel circuits 2 in one frame.

The DSF circuit 5 sets a reference potential of a comparator in the ADC 7 as described later. The S/H circuit 6 cyclically samples and holds voltages of the respective signal lines VSL. The ADC 7 converts the sampled and held voltages into digital signals. The logic circuit 8 sequentially holds the AD-converted digital signals. The IF circuit 9 outputs the digital signals held in the logic circuit 8.

Figure 2:
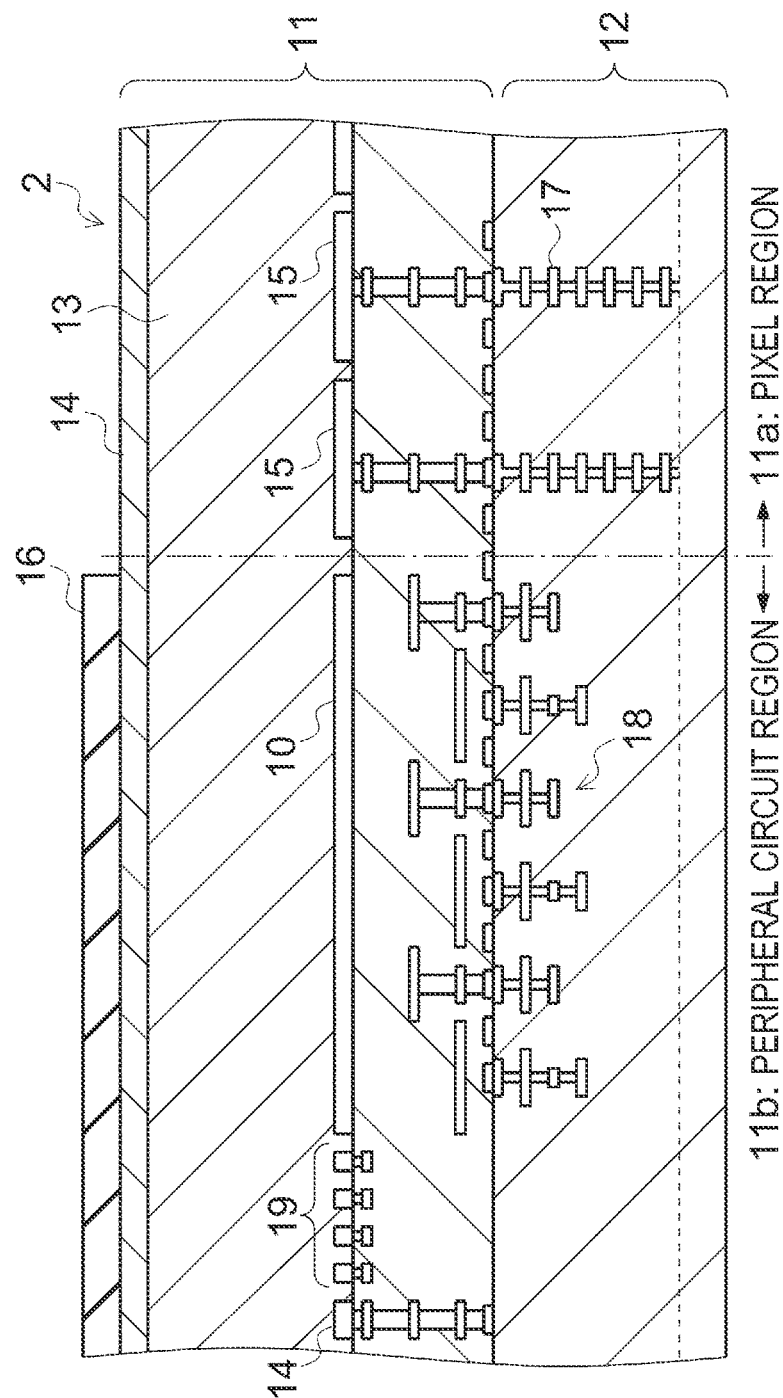
FIG. 2 is a cross-sectional view of the imaging device according to the present embodiment.

FIG. 2 is a cross-sectional view of the imaging device 1 according to the present embodiment. As illustrated in FIG. 2, the imaging device 1 according to the present embodiment is obtained by bonding a first substrate 11 and a second substrate 12 together using Cu—Cu bonding, a via, a bump, or the like. The plurality of pixel circuits 2 is formed in a partial region (pixel region) 11a of the first substrate 11. The first substrate 11 has, for example, a photoelectric conversion region (photodiode) 13 formed by implanting and diffusing impurity ions into a floating zone (FZ) silicon substrate. The photoelectric conversion region 13 includes a cathode (n$^+$ cathode layer) 14 formed on an upper surface side and an anode (p$^+$ anode layer) 15 and a ground layer (GND) 10 formed on a lower surface side.

An X-ray shielding plate 16 is arranged above a region (peripheral circuit region) 11b other than the pixel region 11a of the first substrate 11. On the second substrate 12 located below the X-ray shielding plate 16, a wiring layer 17 connected to the pixel circuit 2 and peripheral circuits 18 such as the DSF circuit 5, the S/H circuit 6, the ADC 7, and the IF circuit 9 which are illustrated in FIG. 1, and a wiring circuit are formed. A guard ring 19 is arranged on a lower surface of the photoelectric conversion region 13 on the peripheral circuit region 11b side, and the cathode (n$^+$ cathode layer) 14 is formed on an outer peripheral side thereof.

Figure 3:
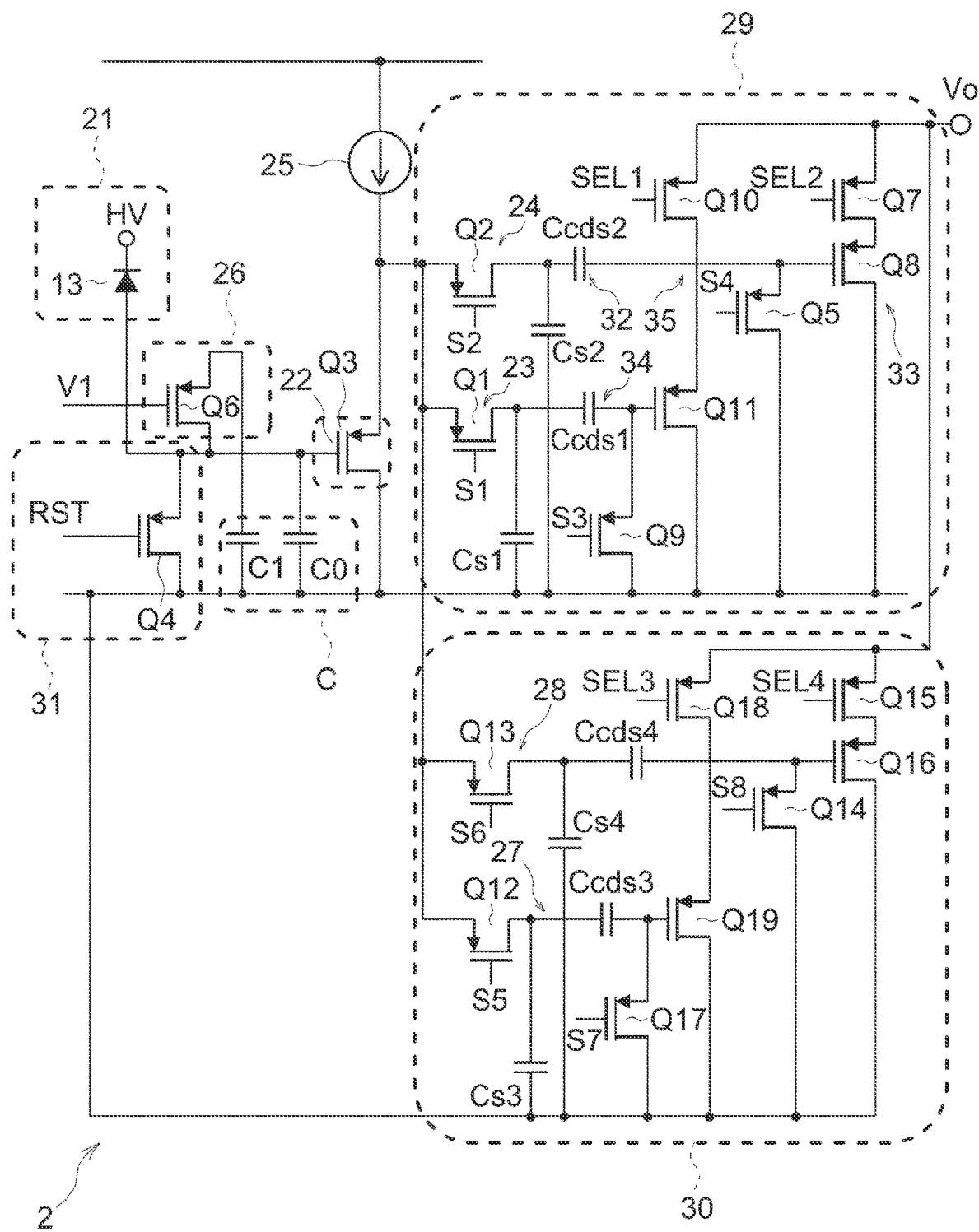
FIG. 3 is a circuit diagram illustrating an example of a specific circuit configuration of a pixel circuit illustrated in FIG. 1.

FIG. 3 is a circuit diagram illustrating an example of a specific circuit configuration of the pixel circuit 2 illustrated in FIG. 1. FIG. 3 illustrates a circuit configuration of one pixel circuit 2. As illustrated in FIG. 3, the pixel circuit 2 includes a conversion unit 21, a first capacitor C0, a second capacitor C1, a voltage buffer 22, a first storage unit 23, and a second storage unit 24. The pixel circuit 2 illustrated in FIG. 3 includes a plurality of transistors. FIG. 3 illustrates an example in which all of the plurality of transistors are configured using PMOS transistors, but may be configured using NMOS transistors.

The conversion unit 21 is the photodiode 13 that converts an incident electromagnetic wave (X-ray) into a charge. The first capacitor C0 and the second capacitor C1 constitute a conversion capacitance C, and a charge according to the incident intensity of the X-ray is accumulated in at least one of the first capacitor C0 or the second capacitor C1. In the first capacitor C0 and the second capacitor C1, a voltage between both electrodes of each of the capacitors increases as the amount of the accumulated charge increases. The first capacitor C0 accumulates a charge when a voltage corresponding to the charge is equal to or lower than a predetermined threshold. The second capacitor C1 accumulates a charge when a voltage corresponding to the charge exceeds the threshold.

In this manner, the first capacitor C0 accumulates the charge when the incident intensity of the X-ray is not so high, and the second capacitor C1 starts accumulating the charge when the accumulated charge in the first capacitor C0 increases to some extent.

The voltage buffer 22 is a voltage conversion circuit that converts the charges accumulated in the first capacitor C0 and the second capacitor C1 into voltages. The voltage buffer 22 includes a transistor Q3. A current source 25 is connected between a source of the transistor Q3 and the power supply voltage node. The anode of the photodiode 13, one end of the first capacitor C0, and one end of the second capacitor C1 are connected to a gate of the transistor Q3. The transistor Q3 has a drain connected to a ground node. A source voltage of the transistor Q3 changes according to the accumulated charges in the first capacitor C0 and the second capacitor C1.

The first storage unit 23 stores a voltage corresponding to the accumulated charge in the first capacitor C0 after a lapse of a first period since the first capacitor C0 has started accumulating the charge. In the present embodiment, it is assumed that exposure and voltage transfer to the signal line VSL are performed in one frame period, and the first period is a period in one frame period.

The first storage unit 23 includes, for example, a capacitor Cs1 and a transistor Q1. The capacitor Cs1 is connected between a drain of the transistor Q1 and a reference voltage node (for example, a ground node). A signal S1 is input to a gate of the transistor Q1.

The second storage unit 24 stores a voltage corresponding to the accumulated charges in the first capacitor C0 and the second capacitor C1 after a lapse of a second period longer than the first period since the first capacitor C0 has started accumulating the charge. The second period is a period in one frame period.

The second storage unit 24 includes, for example, a transistor Q2 and a capacitor Cs2. The capacitor Cs2 is connected between a drain of the transistor Q2 and the ground node. A signal S2 is input to a gate of the transistor Q2.

As illustrated in FIG. 3, the pixel circuit 2 according to the present embodiment may include a first voltage limiter 26. The first voltage limiter 26 blocks the accumulation of the charge in the second capacitor C1 in a case where the voltage corresponding to the charge is equal to or lower than the threshold, and accumulates the charge in the second capacitor C1 when the voltage exceeds the threshold. The first voltage limiter 26 includes, for example, a transistor Q6. A voltage V1 is input to a gate of the transistor Q6. A drain of the transistor Q6 is connected to one end of the second capacitor C1, and a source of the transistor Q6 is connected to the anode of the photodiode 13 and one end of the first capacitor C0. It is possible to control a voltage of the anode of the photodiode 13 at which the second capacitor C1 start accumulating the charge by controlling the gate voltage V1 of the transistor Q6.

As illustrated in FIG. 3, the pixel circuit 2 according to the present embodiment may include a third storage unit 27 and a fourth storage unit 28. The third storage unit 27 stores the voltage corresponding to the accumulated charge in the first capacitor C0 after the lapse of the first period since the first capacitor C0 has started accumulating the charge, which is similar to the first storage unit 23.

The fourth storage unit 28 stores the voltage corresponding to the accumulated charges in the first capacitor C0 and the second capacitor C1 after the second period longer than the lapse of the first period since the first capacitor C0 has started accumulating the charge, which is similar to the second storage unit 24.

As illustrated in FIG. 3, the pixel circuit 2 according to the present embodiment can include: a first system unit 29 including the first storage unit 23 and the second storage unit 24; and a second system unit 30 including the third storage unit 27 and the fourth storage unit 28. Therefore, exposure results of a previous frame stored in the third storage unit 27 and the fourth storage unit 28 in the second system unit 30 can be output to the signal line VSL while the voltages corresponding to the charges accumulated in the first capacitor C0 and the second capacitor C1 by exposure are being stored in the first storage unit 23 and the second storage unit 24 in the first system unit 29, and furthermore, the voltages corresponding to the charges accumulated in the first capacitor C0 and the second capacitor C1 by exposure can be stored in the third storage unit 27 and the fourth storage unit 28 in the second system unit 30 while the voltages stored in the first storage unit 23 and the second storage unit 24 in the first system unit 29 are being output to the signal line VSL. Therefore, the pixel circuit 2 in FIG. 3 can perform the exposure in most of one frame period.

As illustrated in FIG. 3, the pixel circuit 2 according to the present embodiment may include a first reset circuit 31 and a fifth storage unit 32. The first reset circuit 31 discharges and initializes the accumulated charges in the first capacitor C0 and the second capacitor C1. The first reset circuit 31 includes, for example, a transistor Q4. A source of the transistor Q4 is connected to the anode of the photodiode 13, one end of the first capacitor C0, one end of the second capacitor C1, and the gate of the transistor Q6 in the voltage buffer 22. A drain of the transistor Q4 is connected to the ground node. The transistor Q4 is turned on to perform an initialization operation when a signal RST input to its gate is low.

The fifth storage unit 32 stores an initialization voltage when the first capacitor C0 and the second capacitor C1 are initialized. The fifth storage unit 32 includes, for example, a transistor Q5 and a capacitor Ccds2. One end of the capacitor Ccds2 is connected to the drain of the transistor Q2, and another end of the capacitor Ccds2 is connected to a source of the transistor Q5. A drain of the transistor Q5 is connected to the ground node. A signal S4 is input to a gate of the transistor Q5.

As illustrated in FIG. 3, the pixel circuit 2 according to the present embodiment may include a first transfer circuit 33. The first transfer circuit 33 outputs a differential voltage between the voltage stored in the second storage unit 24 and the voltage stored in the fifth storage unit 32 to the signal line VSL every frame period. The first transfer circuit 33 includes, for example, cascode-connected transistors Q7 and Q8. The transistor Q7 has a source connected to an output node of the pixel circuit 2 and a drain connected to a source of the transistor Q8. A drain of the transistor Q8 is connected to the ground node. A signal SEL2 is input to a gate of the transistor Q7. A gate of the transistor Q8 is connected to the another end of the capacitor Ccds2 and the source of the transistor Q5.

As illustrated in FIG. 3, the pixel circuit 2 according to the present embodiment may include a sixth storage unit 34. The sixth storage unit 34 stores a voltage of a charge transfer path immediately after the initialization by the first reset circuit 31 is released. The sixth storage unit 34 stores kTC noise when the first reset circuit 31 releases reset. The sixth storage unit 34 includes, for example, a transistor Q9 and a capacitor Ccds1. The capacitor Ccds1 is connected between the drain of the transistor Q1 and a source of the transistor Q9. A drain of the transistor Q9 is connected to the ground node. A signal S3 is input to a gate of the transistor Q9.

As illustrated in FIG. 3, the pixel circuit 2 according to the present embodiment may include a second transfer circuit 35. The second transfer circuit 35 outputs a differential voltage between the voltage stored in the first storage unit 23 and the voltage stored in the sixth storage unit 34 to the signal line VSL every frame period. The second transfer circuit 35 includes, for example, cascode-connected transistors Q10 and Q11. A source of the transistor Q10 is connected to the output node of the pixel circuit 2. A drain of the transistor Q10 is connected to a source of the transistor Q11. A drain of the transistor Q11 is connected to the ground node. A signal SEL1 is input to the gate of a transistor Q10. A gate of the transistor Q11 is connected to another end of the capacitor Ccds1 and the source of the transistor Q9.

In this manner, the first system unit 29 in the pixel circuit 2 in FIG. 3 includes the transistors Q1, Q2, Q5, and Q7 to Q11 and the capacitors Cs1, Cs2, Ccds1, and Ccds2. Furthermore, the second system unit 30 having the same circuit configuration as the first system unit 29 includes transistors Q12 to Q19 and capacitors Cs3, Cs4, Ccds3, and Ccds4. As described above, the first system unit 29 and the second system unit 30 alternately perform exposure or voltage transfer to the signal line VSL in each frame period.

Figure 4:
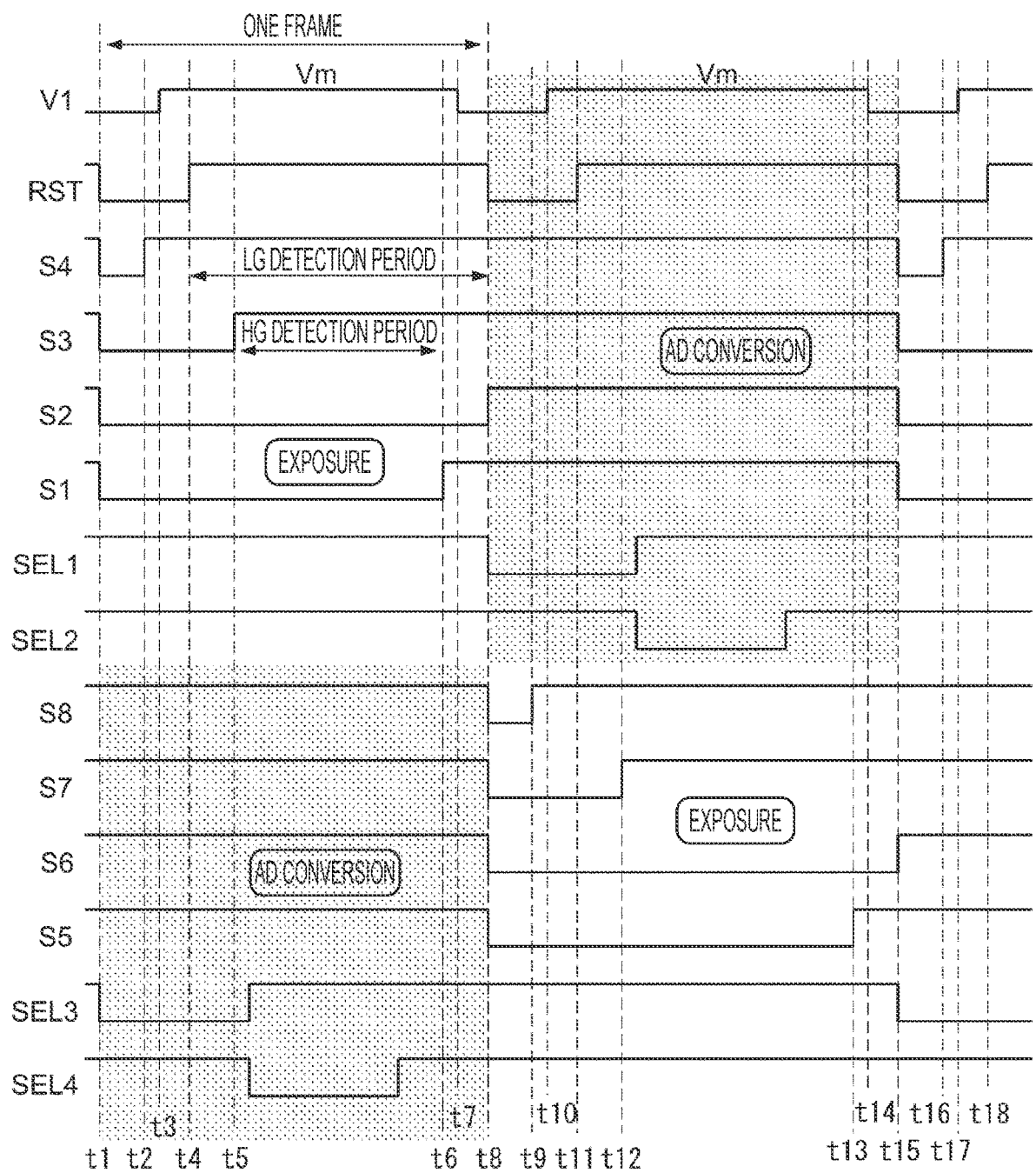
FIG. 4 is a timing chart of the pixel circuit of FIG. 3.

FIG. 4 is a timing chart of the pixel circuit 2 of FIG. 3. Hereinafter, the operations of the pixel circuit 2 in FIG. 3 will be described with reference to FIG. 4.

First, at a time t1, the signal RST becomes low so that the transistor Q4 in the first reset circuit 31 is turned on, and the signal V1 is low so that the transistor Q6 in the first voltage limiter 26 is turned on. Therefore, the first capacitor C0 and the second capacitor C1 connected to both the sources of the transistors Q6 and Q4 discharge accumulated charges to be initialized. At this time, the signals S2 and S4 are low, and thus, the transistor Q2 in the second storage unit 24 and the transistor Q5 in the fifth storage unit 32 are turned on, and a charge according to a reset potential is accumulated in the capacitor Ccds2.

Thereafter, at a time t2, the signal S4 becomes high so that the transistor Q5 is turned off. Therefore, the capacitor Ccds2 stores the reset potential obtained when the first reset circuit 31 has initialized the first capacitor C0 and the second capacitor C1.

Thereafter, at a time t3, the gate voltage of the transistor Q6 in the first voltage limiter 26 is set to a voltage level Vm according to a gain switching mode. For example, the gate voltage Vm of the transistor Q6 is set in advance such that the transistor Q6 is turned on when a certain amount or more of current flows through the anode of the photodiode 13 in order to operate the pixel circuit 2 in a mode (hereinafter, referred to as a two-gain mode) in which two gains can be switched. In this case, the transistor Q6 is turned on when the anode voltage of the photodiode 13 exceeds Vm+Vth. On the other hand, the gate voltage Vm at a high voltage level is set such that the transistor Q6 is always turned off in order to operate the pixel circuit 2 in a gain-fixed mode.

Thereafter, at a time t4, the signal RST becomes high, the transistor Q4 in the first reset circuit 31 is turned off, and reset is released. After the time t4, a charge photoelectrically converted by the photodiode 13 is accumulated in the first capacitor C0, and a charge is also accumulated in the capacitor Cs1 according to the accumulated charge.

Thereafter, at a time t5, the signal S3 becomes high, the transistor Q9 in the sixth storage unit 34 is turned off, and kTC noise generated when the first reset circuit 31 has released the reset is stored in the capacitor Ccds1.

Thereafter, at a time t6, the signal S1 becomes high so that the transistor Q1 in the first storage unit 23 is turned off. Therefore, a voltage corresponding to the accumulated charge in the first capacitor C0 is stored in the capacitor Cs1 in the first storage unit 23. An exposure time period using the first capacitor C0 is between the time t5 and the time t6. Hereinafter, a gain in a case where exposure is performed using only the first capacitor C0 is referred to as a high conversion gain C0.

At a time t7, the gate voltage of the transistor Q6 in the first voltage limiter 26 is lowered, the transistor Q6 is completely turned on, and both the first capacitor C0 and the second capacitor C1 accumulate the charge from the photodiode 13.

Thereafter, at a time t8, the signal S2 becomes high so that the transistor Q2 in the second storage unit 24 is turned off. Therefore, a voltage corresponding to the accumulated charges in the first capacitor C0 and the second capacitor C1 is accumulated in the capacitor Cs2 in the second storage unit 24. An exposure time period using the first capacitor C0 and the second capacitor C1 is between the time t4 and a time t8. Hereinafter, a gain in a case where exposure is performed using the first capacitor C0 and the second capacitor C1 is referred to as a low conversion gain (C0+C1).

When the anode voltage of the photodiode 13 becomes Vm+Vth, the transistor Q6 is turned on, and thus, a limit is applied at Vm+Vth. Thus, the gate voltage Vm of the transistor Q6 is appropriately set so that saturation of the pixel circuit 2 can be avoided.

Furthermore, a dynamic range of the high conversion gain C0 can be secured until the anode voltage of the photodiode 13 becomes Vm+Vth.

When the anode voltage of the photodiode 13 exceeds Vm+Vth, the charge from the photodiode 13 is accumulated in the second capacitor C1, and thus, there is no possibility that the charge from the photodiode 13 disappears. The transistor Q6 in the first voltage limiter 26 is completely turned on at the time t7, the charges accumulated in the first capacitor C0 and the second capacitor C1 can be converted into a voltage with the low conversion gain (C0+C1).

In this manner, the voltage with the high conversion gain C0 and the voltage with the low conversion gain (C0+C1) can be obtained for the exposure time periods having substantially the same length, and the dynamic range can be expanded. In a case where photoelectric conversion is performed with the high conversion gain C0, S/N is important, and thus, noise can be reduced by offsetting the kTC noise at the time of reset, and one photon of an X-ray can be accurately detected.

From the time t1 to the time t8 in FIG. 4, for example, the first system unit 29 of the pixel circuit 2 in FIG. 3 performs an exposure operation, and the second system unit 30 outputs voltages stored in the third storage unit 27 and the fourth storage unit 28 by exposure in a previous frame to the signal line VSL during the exposure operation. More specifically, the transistor Q18 is turned on at the time t1, and the voltage obtained by subtracting kTC noise stored in the capacitor Ccds3 from a voltage, photoelectrically converted with the high conversion gain C0 in the previous frame and stored in the capacitor Cs3 in the third storage unit 27, is output to the signal line VSL.

Thereafter, at the time t5, the voltage obtained by subtracting a reset potential stored in the capacitor Ccds4 at the time of reset from a voltage, stored in the capacitor Cs4 in the fourth storage unit 28 with the low conversion gain (C0+C1) in the previous frame, is output to the signal line VSL.

Thereafter, in the next frame illustrated from the time t8 to a time t15, the second system unit 30 performs exposure, and the voltages stored in the first storage unit 23 and the second storage unit 24 in the previous frame (the time t1 to the time t8) by the first system unit 29 are output to the signal line VSL. More specifically, at a time t9, a voltage of a charge transfer path at the time of reset is stored in the capacitor Ccds4. Thereafter, at a time t11, a voltage of kTC noise is stored in the capacitor Ccds3. Thereafter, the voltage with the high conversion gain C0 is stored in the capacitor Cs3 at a time t13. Thereafter, a voltage with the low conversion gain (C0+C1) is stored in the capacitor Cs4 at the time t15.

Furthermore, while the second system unit 30 is performing the exposure from the time t8 to the time t15, the transistor Q10 in the first system unit 29 is turned on at the time t8, and outputs a voltage, obtained by subtracting the voltage of the kTC noise stored in the capacitor Ccds1 from the voltage stored in the capacitor Cs1 with the high conversion gain C0, to the signal line VSL. Furthermore, the transistor Q7 is turned on after a time t12, and outputs a voltage, obtained by subtracting a reset voltage stored in the capacitor Ccds2 from the voltage stored in the capacitor Cs2 with the low conversion gain (C0+C1), to the signal line VSL.

Figure 5:
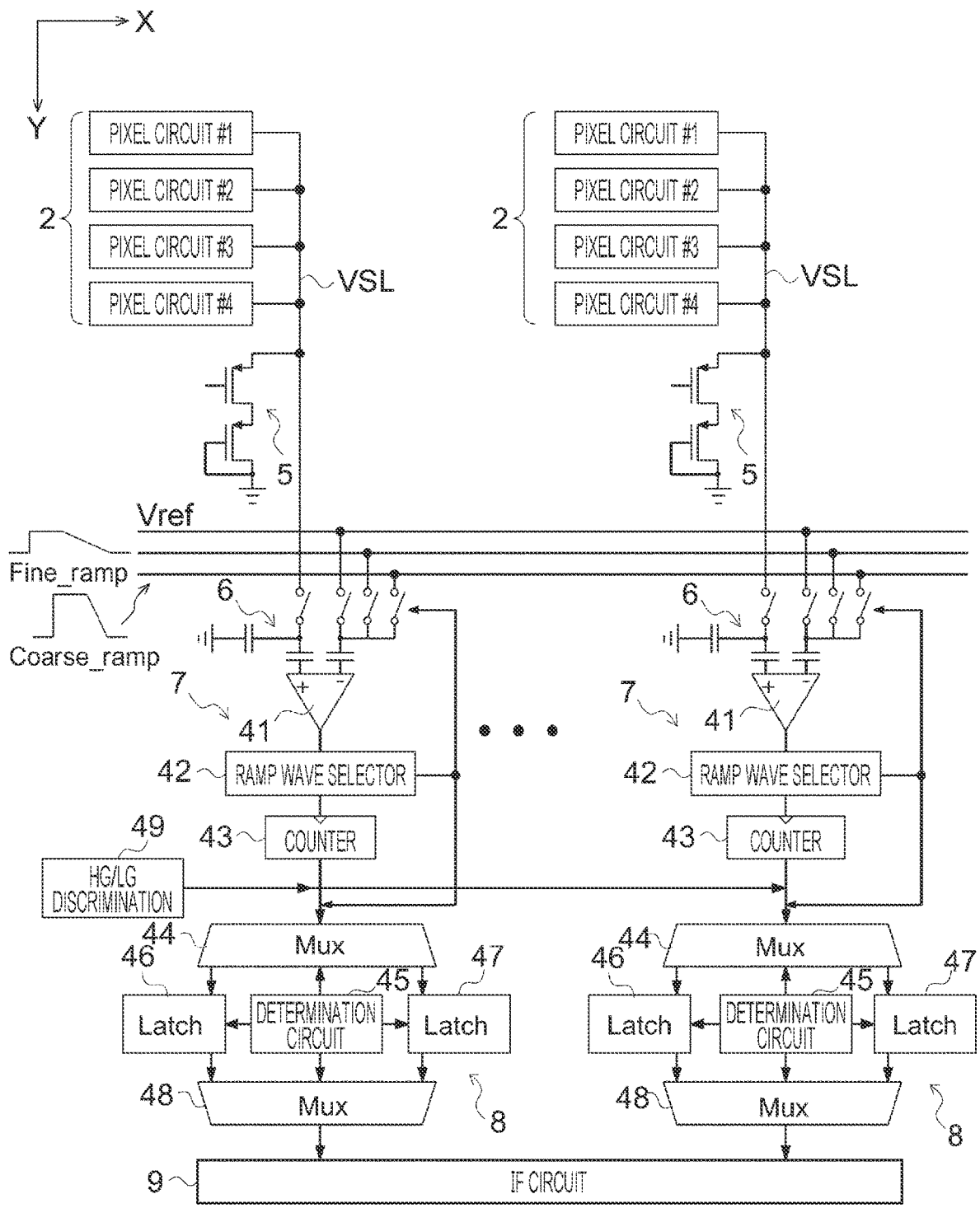
FIG. 5 is a block diagram illustrating a configuration of the imaging device on the subsequent stage side of a signal line.

FIG. 5 is a block diagram illustrating a configuration of the imaging device 1 on the subsequent stage side of the signal line VSL. The plurality of signal lines VSL is arranged in the horizontal direction X, and a plurality of the pixel circuits 2 is connected to each of the signal lines VSL. Voltages output from the plurality of pixel circuits 2 in one frame are sequentially sent to the signal line VSL. The plurality of signal lines VSL transfers the voltages respectively output from the pixel circuits 2 in parallel at the same time.

The DSF circuit 5 is connected to each of the signal lines VSL. The DSF circuit 5 operates once in one frame and sets a potential of the corresponding signal line VSL to the reference potential. Therefore, the reference potential of the comparator in the ADC 7 is set.

The voltage of each of the signal lines VSL is sampled and held by the S/H circuit 6 before being subjected to AD conversion in the ADC 7. In X-ray imaging, an imaging size of each pixel is large, and a length of the signal line VSL connected to the pixel circuit 2 is about 5 cm, for example. Thus, even if a certain pixel is selected to output a voltage, it takes time to perform settling with a time constant due to a resistance or capacitance of the signal line VSL, and thus, the number of times AD conversion can be performed in one frame decreases. Therefore, the S/H circuit is provided on the preceding stage side of the ADC 7 to shorten time for the settling of a signal line voltage on the signal line VSL in the present embodiment.

The voltage of each of the signal lines VSL is sampled and held by the S/H circuit 6 every predetermined period. The respective pixel circuits 2 output the voltage with the high conversion gain C0 and the voltage with the low conversion gain (C0+C1) to each of the signal lines VSL with time shifted, and these voltages are sequentially sampled and held by the S/H circuit 6.

The ADC 7 includes a comparator 41, a ramp wave selector 42, and a counter 43. The comparator 41 compares the sampled and held signal line voltage with a ramp wave voltage. Two types of ramp wave voltages and a reference voltage Vref are input to the ADC 7 of FIG. 5. Hereinafter, these two types of ramp wave voltages are referred to as a coarse ramp wave voltage (Coarse ramp or first ramp wave voltage) and a fine ramp wave voltage (Fine_ramp or second ramp wave voltage). The fine ramp wave voltage has a smaller change width of a voltage amplitude and a lower voltage change rate over time than the coarse ramp wave voltage. The comparator 41 and the ramp wave selector 42 in the ADC 7 of FIG. 5 compare the sampled and held signal line voltage with the reference voltage Vref, select the coarse ramp wave voltage when the signal line voltage is higher than the reference voltage Vref, and select the fine ramp wave voltage when the signal line voltage is equal to or lower than the reference voltage Vref.

The comparator 41 compares the signal line voltage with the coarse ramp wave voltage or the fine ramp wave voltage, and the counter 43 counts a period from the sampling and holding time to a time when the signal line voltage intersects the coarse ramp wave voltage or the fine ramp wave voltage. A count value of the counter 43 is a digital signal obtained by performing AD conversion of the signal line voltage.

The logic circuit 8 includes a first multiplexer (MUX) 44, a determination circuit 45, a first holding circuit (Latch 1) 46, a second holding circuit (Latch 2) 47, and a second multiplexer (MUX) 48.

The first multiplexer 44 divides and outputs the digital signal output from the counter 43 into two systems in parallel.

The determination circuit 45 determines which digital signal of the high conversion gain C0 and the low conversion gain (C0+C1) is to be output. The determination circuit 45 determines to output the digital signal of the low conversion gain (C0+C1) when the digital signal of the high conversion gain is saturated, and determines to output the digital signal of the high conversion gain C0 when the digital signal of the high conversion gain is not saturated.

The first holding circuit 46 or the second holding circuit 47 latches the digital signal on the basis of a determination result in the determination circuit 45. A free holding circuit is selected from the first holding circuit 46 and the second holding circuit 47 to latch the digital signal. The digital signals latched by the first holding circuit 46 and the second holding circuit 47 are sent to the IF circuit 9 via the second multiplexer 48. The second multiplexer 48 controls whether or not to send the digital signals latched by the first holding circuit 46 and the second holding circuit 47 to the IF circuit 9 on the basis of a determination result of the determination circuit 45.

The IF circuit 9 outputs the digital signal latched by the first holding circuit 46 or the second holding circuit 47 to the outside.

Since the pixel circuits 2 sequentially output the voltage with the high conversion gain C0 and the voltage with the low conversion gain (C0+C1) to the signal line VSL, the number of digital signals to be output is too large if the logic circuit 8 outputs all of the digital signal corresponding to the voltage with the high conversion gain C0 and the digital signal corresponding to the voltage with the low conversion gain (C0+C1) output from all the pixel circuits 2, which becomes a factor of deterioration in an imaging operation of the imaging device 1. Thus, the determination circuit 45 as illustrated in FIG. 5 is provided to output only a valid digital signal, the imaging operation of the imaging device 1 can be speeded up.

Furthermore, when a digital signal output from the counter 43 has n bits, the HG/LG discriminator 49 can discriminate whether the digital signal has the high conversion gain C0 or the low conversion gain (C0+C1), add 1 bit to a result of the discrimination, and outputs a digital signal having (n+1) bits from the IF circuit 9. Therefore, either the digital signal of the high conversion gain C0 or the digital signal of the low conversion gain (C0+C1) can be easily identified.

As illustrated in FIG. 5, since the plurality of pixel circuits 2 is connected to one signal line VSL, the signal line voltage with the high conversion gain C0 and the signal line voltage with the low conversion gain (C0+C1) output from the respective pixel circuits 2 are sequentially transferred in one frame period. For example, in a case where four pixel circuits 2 are connected to one signal line VSL, eight (2×4=8) signal line voltages are transferred by the signal line VSL in one frame period, and the ADC 7 performs AD conversion eight times in one frame period.

Since the first system unit 29 and the second system unit 30 alternately perform the exposure and the AD conversion in one frame period as illustrated in FIG. 4 in the present embodiment, the exposure operation can be performed in most of one frame period even if the AD conversion is performed a plurality of times in the one frame period.

The determination circuit 45 in the logic circuit 8 illustrated in FIG. 5 is not an essential configuration, and may be omitted. Furthermore, the first holding circuit 46 and the second holding circuit 47 are provided in the logic circuit 8 in FIG. 5, but only one holding circuit may be provided.

Figure 6:
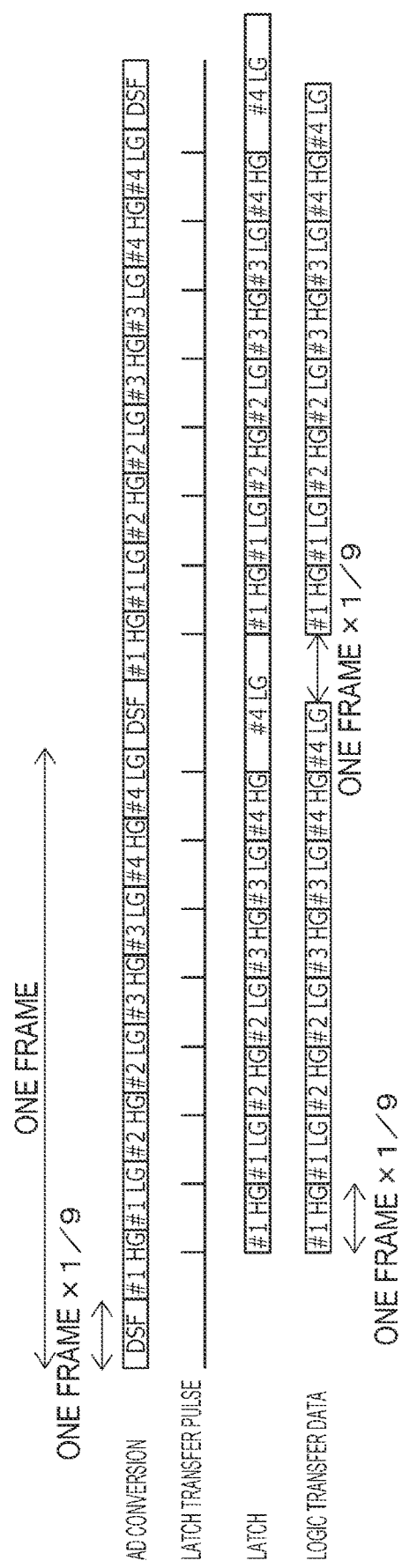
FIG. 6 is a timing chart of an ADC and a logic circuit in a case where the logic circuit does not include a determination circuit but includes only one holding circuit.

FIG. 6 is a timing chart of the ADC 7 and the logic circuit 8 in a case where the logic circuit 8 does not include the determination circuit 45 but includes only one holding circuit. FIG. 6 illustrates timings of digital signals output from the ACD 7, timings of latch transfer pulses input to the holding circuit, timings of latch output signals of the holding circuit, and transfer timings of the logic circuit 8.

FIG. 6 illustrates an example in which four pixel circuits 2 (pixel circuits #1 to #4 in FIG. 6) are connected to one signal line VSL. At the beginning of one frame period, the ADC 7 performs Auto Zero with the reference potential of the signal line VSL set by the DSF circuit 5 to set the reference potential of the comparator 41, thereafter, performs AD conversion on the signal line voltage (HG in FIG. 6) with the high conversion gain C0 output from each of the pixel circuits 2, and subsequently performs AD conversion on the signal line voltage (LG in FIG. 6) with the low conversion gain (C0+C1). Such a series of operations is repeated for each of the four pixel circuits 2. Eventually, the ADC 7 performs AD conversion for a total of eight pixels in one frame period. The holding circuit in the logic circuit 8 sequentially latches the digital signals for the eight pixels output from the ADC 7. A cycle in which the holding circuit holds each of the digital signals is ⅛ of one frame period.

Figure 7:
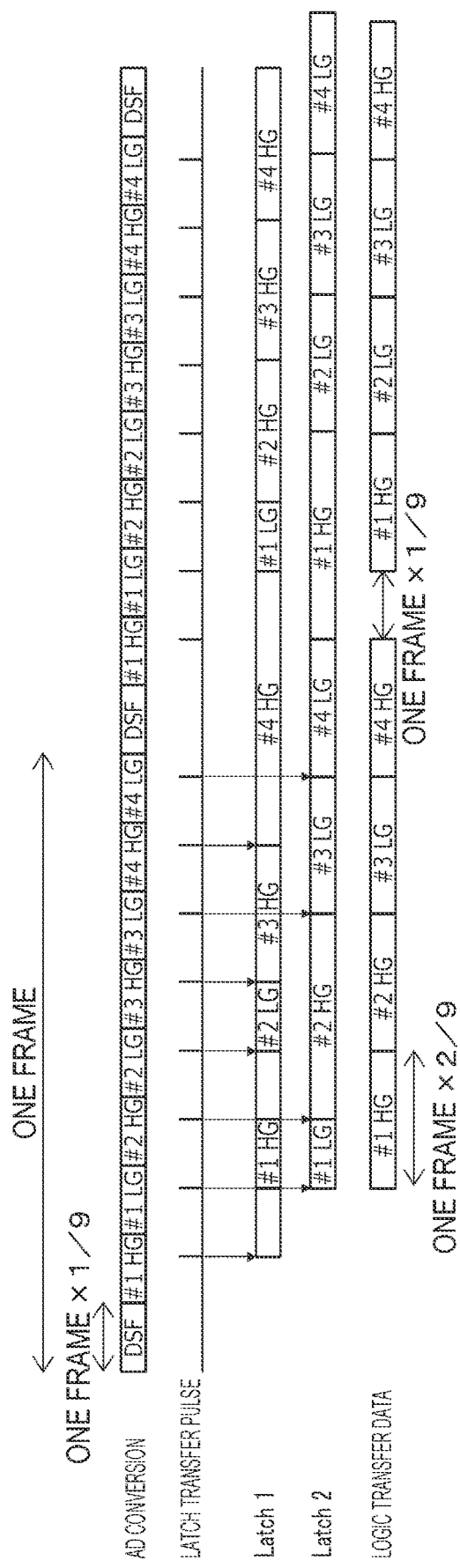
FIG. 7 is a timing chart of the ADC and the logic circuit in a case where the logic circuit includes the determination circuit, a first holding circuit, and a second holding circuit.

FIG. 7 is a timing chart of the ADC 7 and the logic circuit 8 in a case where the logic circuit 8 includes the determination circuit 45, the first holding circuit 46, and the second holding circuit 47. FIG. 7 illustrates timings of digital signals output from the ACD 7, timings of latch transfer pulses input to the first holding circuit 46 and the second holding circuit 47, timings of latch output signals (Latch 1) of the first holding circuit 46, a timing of latch output signals (Latch 2) of the second holding circuit 47, and transfer timings of the logic circuit 8.

As described above, the ADC 7 performs AD conversion for eight pixels in one frame period and allocates the digital signals after subjected the AD conversion to the first holding circuit 46 and the second holding circuit 47, so that the logic circuit 8 only needs to transfer data for one pixel in 2/8 frame period. Therefore, there is a time margin for the processing of the logic circuit 8, and a frame rate can be further improved accordingly.

Although the pixel circuit 2 in FIG. 3 can switch between the high conversion gain C0 and the low conversion gain (C0+C1), a mode of fixing a gain to the high conversion gain C0 or the low conversion gain (C0+C1) may be provided. When the gain is fixed, an imaging speed can be improved.

Figure 8:
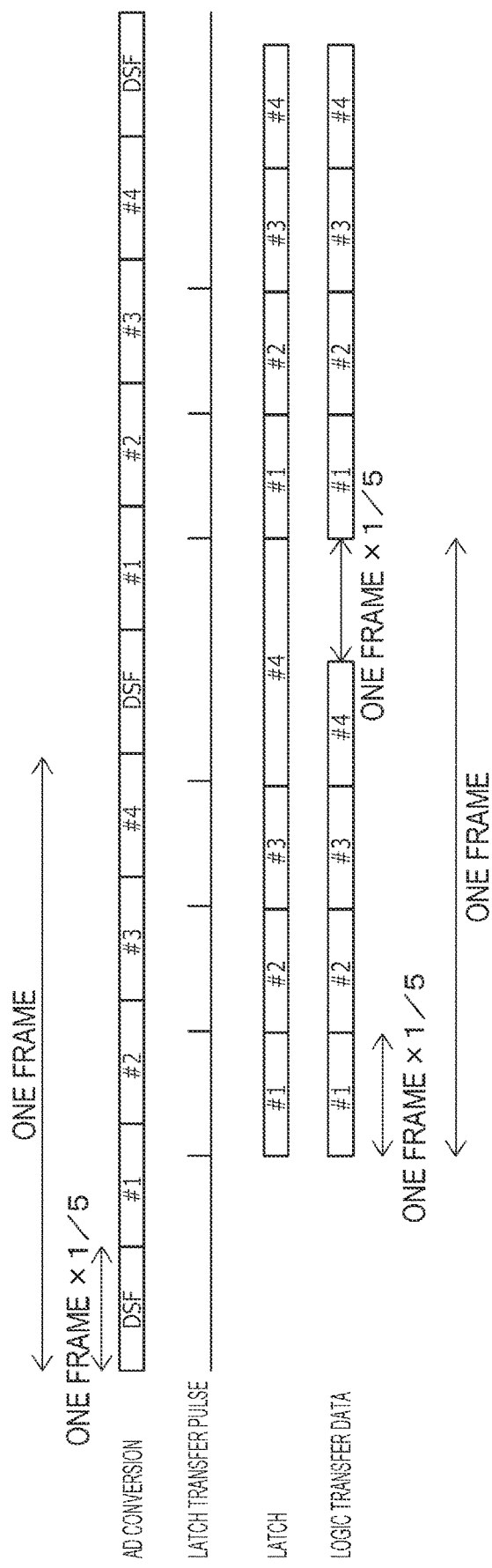
FIG. 8 is a timing chart of the ADC and the logic circuit in a case where a gain of the pixel circuit is fixed and the logic circuit is provided with one holding circuit.

FIG. 8 is a timing chart of the ADC 7 and the logic circuit 8 in a case where a gain of the pixel circuit 2 is fixed and the logic circuit 8 is provided with one holding circuit. In this case, since the ADC 7 is only required to perform AD conversion for four pixels in one frame period, the ADC 7 only needs to perform AD conversion for one pixel in 1/5 frame period. Therefore, since the number of times of the AD conversion of the ADC 7 is smaller than that in the case of FIG. 6, the frame rate can be improved accordingly.

Figure 9:
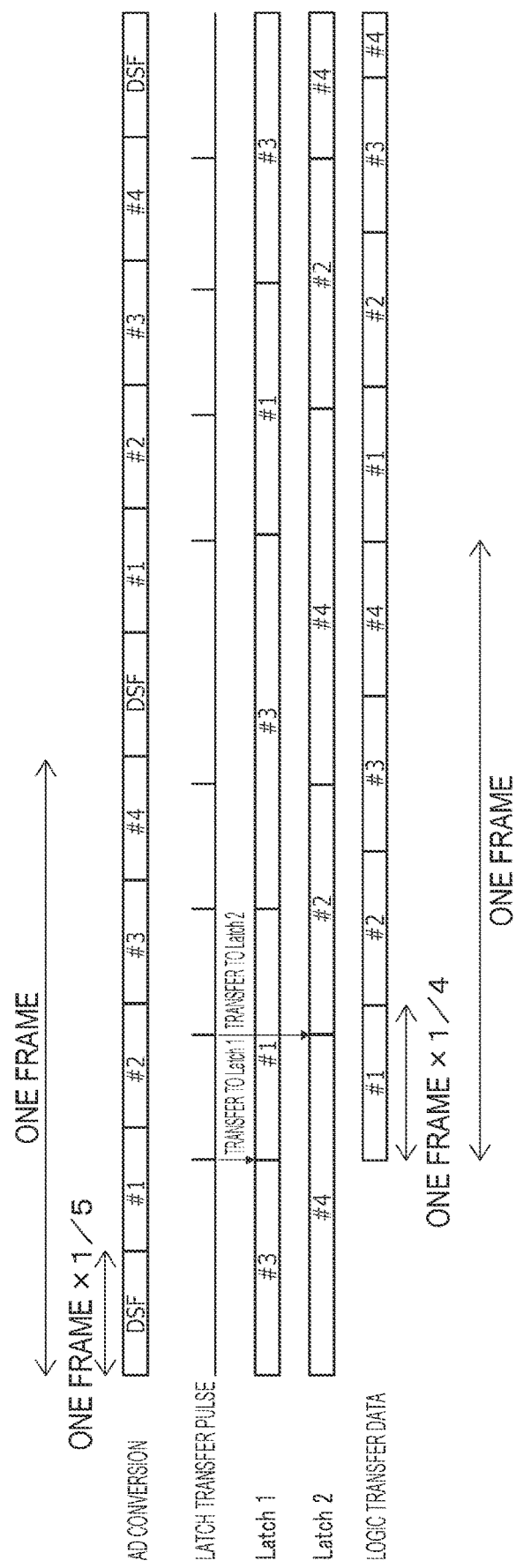
FIG. 9 is a timing chart in a case where the gain of the pixel circuit is fixed and the logic circuit is provided with the first holding circuit and the second holding circuit.

FIG. 9 is a timing chart in a case where a gain of the pixel circuit 2 is fixed and the logic circuit 8 is provided with the first holding circuit 46 and the second holding circuit 47. In the case of FIG. 9, the logic circuit 8 is only required to transfer digital data of each pixel in 1/4 frame period, the frame rate can be improved as compared with the cases of FIGS. 6 to 8.

Figure 10:
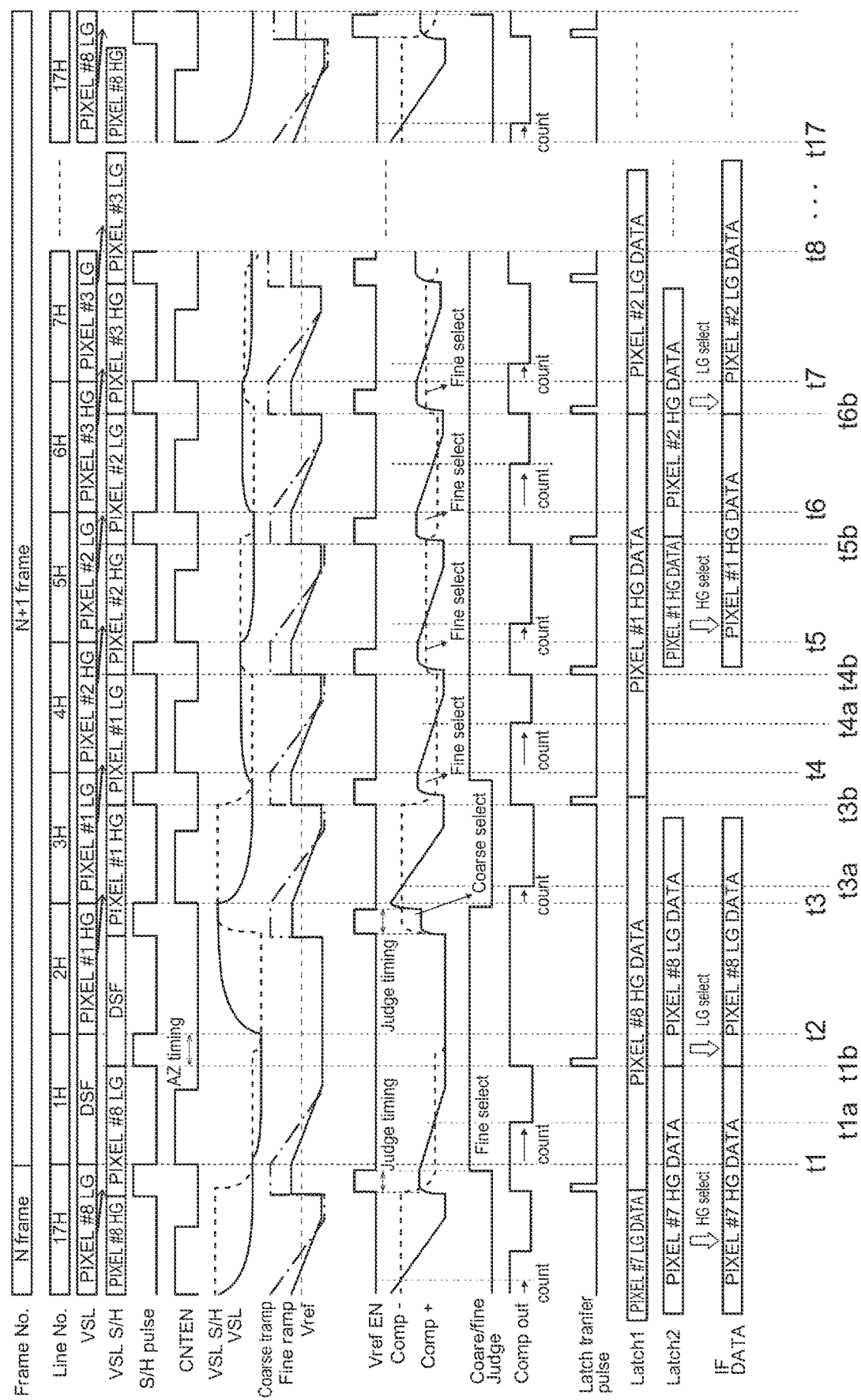
FIG. 10 is a detailed timing chart illustrating operations of the imaging device according to the present embodiment.

FIG. 10 is a detailed timing chart illustrating operations of the imaging device 1 according to the present embodiment. The timing chart of FIG. 10 illustrates an example in which eight pixel circuits 2 are connected to one signal line VSL, and the respective pixel circuits 2 sequentially output data of the high conversion gain C0 and data of the low conversion gain (C0+C1) to the signal line VSL. Since the respective pixel circuits 2 output two signal line voltages and the DSF circuit 5 sets a signal line voltage to a reference potential at the head of each frame period, a total of 1+8+8=17 signal line voltages are transferred through one signal line VSL in one frame period.

At a time t1, the S/H circuit 6 samples and holds the signal line voltage. At this time point, the signal line voltage is low, and thus, the comparator 41 selects the fine ramp wave voltage. In FIG. 10, the fine ramp wave voltage is indicated by a solid line, and the coarse ramp wave voltage is indicated by an alternate long and short dash line. The comparator 41 in the ADC 7 compares the sampled and held signal voltage with the fine ramp wave voltage, and the counter 43 performs a counting operation from the time t1 to a time t1a at which the sampled and held signal voltage intersects the fine ramp wave voltage, and outputs a count value obtained at a time t1a as a digital signal. Thereafter, at a time t1b, the second holding circuit 47 latches the digital signal. Therefore, the IF circuit 9 outputs the digital signal latched by the second holding circuit 47 after the time t1b.

At the time t1b, an auto-zero period (AZ period) in which the DSF circuit 5 sets the signal line VSL to the reference potential is started. At a time t2, the S/H circuit 6 samples and holds the reference potential of the signal line VSL. Since the sampled and held signal line voltage is at the reference potential level, the fine ramp wave voltage is selected. Between the time t2 and a time t3, the ADC 7 sets the reference potential of the comparator 41 and does not perform a normal AD conversion operation.

At the time t3, the S/H circuit 6 samples and holds a signal line voltage #1HG with a high gain conversion C0 of the pixel circuit #1. Since the sampled and held signal line voltage is higher than the reference voltage Vref, the coarse ramp wave voltage is selected. Since the sampled and held signal line voltage intersects the coarse ramp wave voltage at a time t3a, the counter 43 in the ADC 7 outputs a count value obtained from the time t3 to the time t3a as a digital signal. At the subsequent time t3b, the first holding circuit 46 latches the digital signal.

Thereafter, at a time t4, the S/H circuit 6 samples and holds a signal line voltage #1LG with a low gain conversion (C0+C1) of the pixel circuit 2 #1. Since the sampled and held signal line voltage is equal to or lower than the reference voltage Vref, the fine ramp wave voltage is selected. Since the sampled and held signal line voltage intersects the fine ramp wave voltage at a time t4a, the counter 43 in the ADC 7 outputs a count value obtained from the time t4 to the time t4a as a digital signal. At the subsequent time t4b, the second holding circuit 47 latches the digital signal.

The determination circuit 45 determines that the digital signal #1HG with the high conversion gain C0 latched in the first holding circuit 46 is not saturated. Therefore, the IF circuit 9 outputs the digital signal #1HG held in the first holding circuit 46 at the time t4b.

On the other hand, at the subsequent time t6b, the determination circuit 45 determines that a digital signal #2HG with the high conversion gain C0 latched in the second holding circuit 47 is saturated. Therefore, the IF circuit 9 outputs the digital signal #2MG of the low conversion gain (C0+C1) latched in the first holding circuit 46 at the time t6b.

Since the first capacitor C0 for the high conversion gain and the second capacitor C1 for the low conversion gain are provided in the pixel circuit 2 in the first embodiment in this manner, it is possible to selectively use the first capacitor C0 and the second capacitor C1 in accordance with the intensity of an electromagnetic wave such as an X-ray incident on the photodiode 13 to store charges. Therefore, even if a strong electromagnetic wave is incident on the photodiode 13, the intensity of the electromagnetic wave can be accurately detected without causing saturation.

Furthermore, since the first system unit 29 and the second system unit 30 are provided in the pixel circuit 2 and the exposure operation and the AD conversion operation are alternately performed, the exposure operation can be performed in most of one frame period, and dead time in which the electromagnetic wave is not receivable can be reduced.

Moreover, since the two types of ramp wave voltages are provided in order to perform the AD conversion operation, it is possible to quickly and accurately perform the AD conversion of the intensity of the electromagnetic wave received by the photodiode 13.

Furthermore, the reset potential when the first reset circuit 31 has been reset is stored, the kTC noise generated when the first reset circuit 31 has released the reset is stored, and the reset potential and the kTC noise are offset when the voltage is output to the signal line VSL, and thus, an S/N ratio can be improved particularly when a weak electromagnetic wave is imaged.

Second Embodiment

A second embodiment provides an HDR mode for further expanding a dynamic range.

A pixel circuit in an imaging device according to the second embodiment has a circuit configuration similar to that in FIG. 3. The pixel circuit according to the second embodiment includes the HDR mode in addition to a high conversion gain mode and a low conversion gain mode described in the first embodiment.

Figure 11:
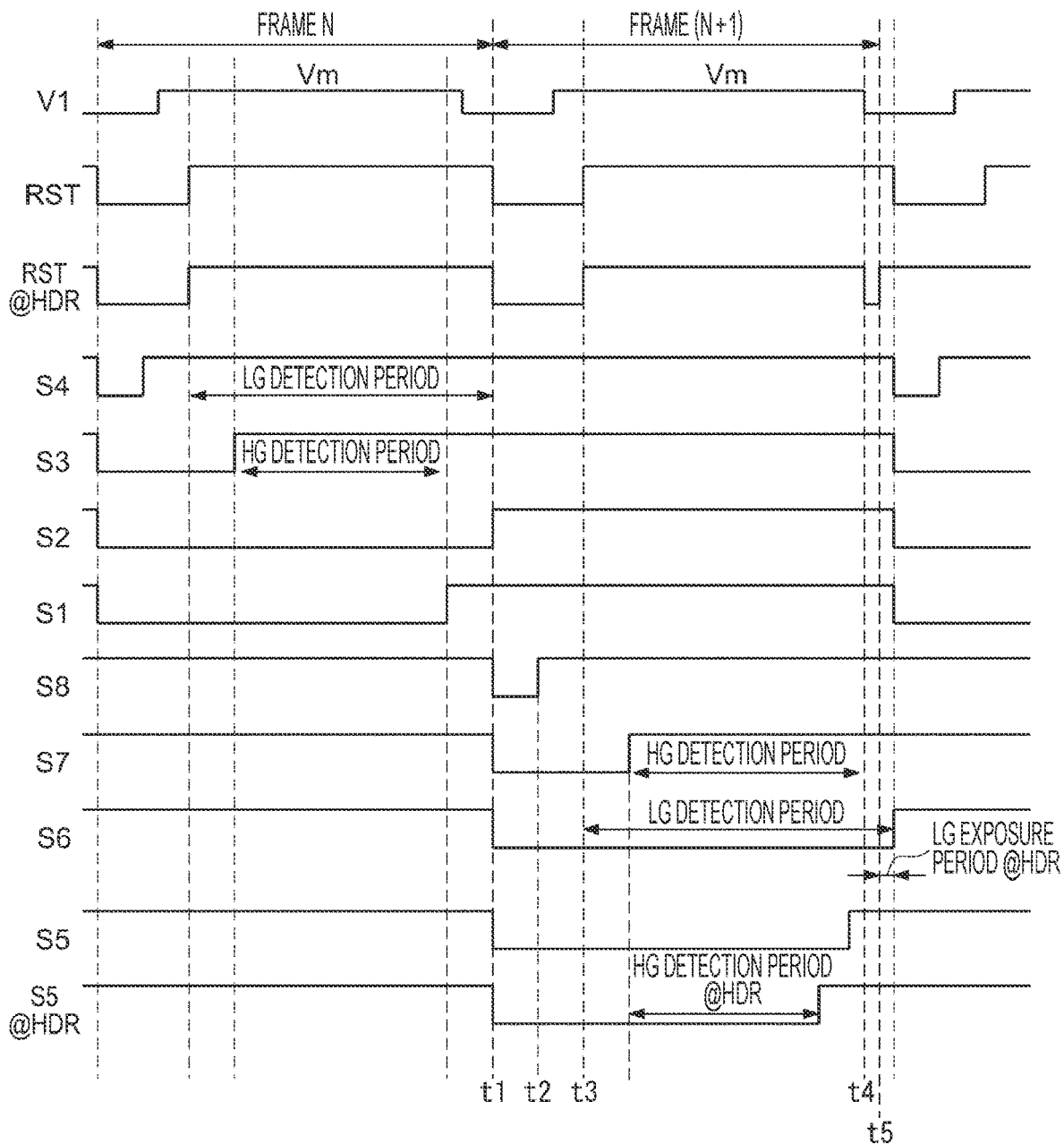
FIG. 11 is a timing chart of a pixel circuit according to a second embodiment.

FIG. 11 is a timing chart of the pixel circuit according to the second embodiment. In FIG. 11, in one frame (Frame N) of two adjacent frames, exposure with the high conversion gain and exposure with the low conversion gain are performed by substantially the same length, and voltages with the respective gains are output to a signal line. In another frame (Frame N+1), an exposure time period with the low conversion gain is made shorter than an exposure time period with the high conversion gain, and voltages with the respective gains are output to the signal line.

In FIG. 11, the high conversion gain is denoted by HG, and the low conversion gain is denoted by LG.

The timing chart of FIG. 11 assumes a situation where an X-ray dose does not change during each frame period. In a case where the X-ray dose does not change over one frame period, there is a possibility that charges accumulated in the first and second capacitors C0 and C1 are saturated. Therefore, an exposure time period is shortened only for the low conversion gain in one frame of the two frames. Therefore, an equivalent dynamic range can be expanded. For example, if an exposure time period with the low conversion gain is shortened to ¹⁄₁₀ of an exposure time period with the high conversion gain, the dynamic range becomes 10 times although the amount of received light does not change.

In the HDR mode, a ratio of the exposure time period/frame period with the high conversion gain is increased such that the single photon can be reliably detected, and the dynamic range can be further expanded by shortening the exposure time period with the low conversion gain.

In the HDR mode, exposure and an AD conversion operation are performed in units of two successive frames. Thus, an equivalent frame rate is ½ of a normal frame rate. In X-ray irradiation, a pixel irradiated with a strong X-ray and a pixel irradiated with only one photon may occur at the same time. In the pixel irradiated with only one photon, it is desirable to extend an exposure time period as much as possible in order to capture the one photon. For example, the exposure time period with the high conversion gain is set to a duty ratio of 90% or more of a total time period of two frames. On the other hand, in the pixel irradiated with the strong X-ray, the low conversion gain is selected. In the example of FIG. 11, since the exposure time period with the low conversion gain LG is slightly longer than the exposure time period with the high conversion gain HG in the N-th frame, imaging data of the low conversion gain LG of Frame N is used as long as the X-ray dose is at an unsaturated level. On the other hand, in a case where the X-ray dose with the low conversion gain LG in Frame N is saturated, imaging data of a short exposure time period with the low conversion gain LG in Frame (N+1) is used.

In a mode other than the HDR mode, the signal S8 becomes high at a time t2, and the transistor Q14 is turned off. Thus, the exposure operation with the low conversion gain is started from a time point when reset is released at the subsequent time t3. On the other hand, in the HDR mode, the signal RST becomes low at a time t4 so that charges in the capacitors C0 and C1 are reset, and the signal RST becomes high at a time t5 so that the transistor Q4 is turned off, and the exposure operation with the low conversion gain is started from this time point.

More specifically, in the HDR mode, in one frame period (for example, a period of Frame (N+1) in FIG. 11) of two successive frame periods, a length of a first period (HG detection period) can be made shorter and accumulated charge amounts in the first capacitor C0 and the second capacitor C1 can be limited as compared with another frame period (for example, a period of Frame N in FIG. 11). That is, in the one frame period, the accumulated charges in the first capacitor C0 and the second capacitor C1 are temporarily discharged before the first period (HG detection period) elapses and a second period (LG detection period) elapses after the first capacitor C0 and the second capacitor C1 have started the charge accumulation, and thereafter, the charge accumulation is resumed. A voltage corresponding to the accumulated charge in the first capacitor C0 is stored in the third storage unit 27 after the lapse of the first period, and a voltage corresponding to the accumulated charges in the first capacitor C0 and the second capacitor C1 is stored in the fourth storage unit 28 after the lapse of the second period. Note that the voltage corresponding to the accumulated charge in the first capacitor C0 may be stored in the first storage unit 23 after the lapse of the first period in the one frame period described above, and the voltage corresponding to the accumulated charges in the first capacitor C0 and the second capacitor C1 may be stored in the fourth storage unit 28 after the lapse of the second period.

Since the HDR mode is newly provided in the second embodiment in this manner, a weak X-ray can be reliably detected, and accurate detection can be performed without saturation even in a case where a strong X-ray is emitted, and the dynamic range can be further expanded.

Note that the present technology can have the following configurations.

(1) An imaging device including:
a conversion unit that converts an incident electromagnetic wave into a charge;
a first capacitor that accumulates the charge when a voltage corresponding to the charge is equal to or lower than a predetermined threshold;
a second capacitor that accumulates the charge when the voltage exceeds the threshold;
a voltage conversion circuit that converts the charges accumulated in the first capacitor and the second capacitor into voltages;
a first storage unit that stores a voltage corresponding to the accumulated charge in the first capacitor after a lapse of a first period since the first capacitor has started accumulating the charge; and a second storage unit that stores a voltage corresponding to the accumulated charges in the first capacitor and the second capacitor after a lapse of a second period longer than the first period since the first capacitor has started accumulating the charge.

(2) The imaging device according to (1), further including:
a third storage unit that stores a voltage corresponding to the accumulated charge in the first capacitor after a lapse of the first period since the first capacitor has started accumulating the charge; and a fourth storage unit that stores a voltage corresponding to the accumulated charges in the first capacitor and the second capacitor after the lapse of the second period since the first capacitor has started accumulating the charge, in which voltages stored in the third storage unit and the fourth storage unit in a frame period immediately before a predetermined frame period are output to a signal line while storing corresponding voltages respectively in the first storage unit and the second storage unit in the predetermined frame period, and the voltages stored in the first storage unit and the second storage unit in the predetermined frame period are output to the signal line while storing corresponding voltages in the third storage unit and the fourth storage unit in a frame period immediately after the predetermined frame period.

(3) The imaging device according to (1) or (2), further including:
 a first reset circuit that discharges the accumulated charges in the first capacitor and the second capacitor for initialization; and
 a fifth storage unit that stores an initialization voltage when the first capacitor and the second capacitor are initialized.

(4) The imaging device according to (3), further including a first transfer circuit that outputs a differential voltage between the voltage stored in the second storage unit and the voltage stored in the fifth storage unit to a signal line every frame period.

(5) The imaging device according to (3) or (4), further including a sixth storage unit that stores a voltage of a path connected to the first reset circuit when the initialization by the first reset circuit is released.

(6) The imaging device according to (5), further including a second transfer circuit that outputs a differential voltage between the voltage stored in the first storage unit and the voltage stored in the sixth storage unit to a signal line every frame period.

(7) The imaging device according to any one of (1) to (6), further including a first voltage limiter that blocks the accumulation of the charge in the second capacitor in a case where the voltage corresponding to the charge is equal to or lower than the threshold, and accumulates the charge in the second capacitor in a case where the voltage exceeds the threshold.

(8) The imaging device according to any one of (1) to (7), further including a mode selection unit that selects whether to store a voltage corresponding to the accumulated charge of one of the first capacitor and the second capacitor in the second storage unit or to store a voltage corresponding to the accumulated charges of the first capacitor and the second capacitor in the second storage unit.

(9) The imaging device according to any one of (1) to (8), further including:
 a sample and hold circuit that samples and holds a voltage of a signal line that sequentially transfers the voltages stored in the first storage unit and the second storage unit at a predetermined cycle; and
 an AD converter that converts the voltage sampled and held by the sample and hold circuit into a digital signal.

(10) The imaging device according to (9), further including:
 a first holding circuit that holds one voltage out of the voltage stored in the first storage unit and the voltage stored in the second storage unit; and
 a second holding circuit that holds another voltage out of the voltage stored in the first storage unit and the voltage stored in the second storage unit.

(11) The imaging device according to (10), further including:
 a determination circuit that determines whether or not the accumulated charge in the first capacitor is saturated on the basis of digital signals held in the first holding circuit and the second holding circuit; and
 a selection circuit that selects and outputs the digital signal held in the first holding circuit or the second holding circuit on the basis of a determination result of the determination circuit.

(12) The imaging device according to any one of (9) to (11), in which
 the AD converter includes:
 a ramp wave selector that selects a first ramp wave voltage when the voltage held in the sample and hold circuit is equal to or higher than a predetermined reference voltage, and selects a second ramp wave voltage having a smaller change width of a voltage amplitude and a lower voltage change rate over time than the first ramp wave voltage when the voltage held in the sample and hold circuit is lower than the reference voltage;
 a comparison unit that compares the voltage held in the sample and hold circuit with the first ramp wave voltage or the second ramp wave voltage; and
 a counter that generates the digital signal on the basis of a comparison result of the comparison unit.

(13) The imaging device according to any one of (9) to (12), further including a plurality of pixel circuits connected to the signal line,
 in which the pixel circuit includes the conversion unit, the first capacitor, the second capacitor, the first storage unit, and the second storage unit, and
 the sample and hold circuit sequentially holds voltages output from the plurality of pixel circuits in one frame period.

(14) the imaging device according to any one of (1) to (13), further including a mode selection unit capable of selecting a predetermined mode for expanding a dynamic range,
 in which, when the predetermined mode is selected, in one frame period out of two successive frame periods, a length of the first period is shortened as compared with length of the first period in another frame period, and an amount of the accumulated charges of the first capacitor and the second capacitor stored in the second storage unit is limited.

(15) The imaging device according to (14), in which
 in the one frame period, the accumulated charges in the first capacitor and the second capacitor are temporarily discharged before the first period elapses and the second period elapses after the first capacitor and the second capacitor have started the charge accumulation, and thereafter, the accumulation of the charges is resumed, and
 the second storage unit stores a voltage corresponding to accumulated charges after the first capacitor and the second capacitor resume the charge accumulation in the one frame period.

(16) The imaging device according to (2), further including a mode selection unit capable of selecting a predetermined mode for expanding a dynamic range,
 in which, when the predetermined mode is selected, in one frame period out of two successive frame periods, a length of the first period is shortened as compared with length of the first period in another frame period, and an amount of the accumulated charges of the first capacitor and the second capacitor stored in the second storage unit and the fourth storage unit is limited.

(17) The imaging device according to (16), in which in the one frame period, the accumulated charges in the first capacitor and the second capacitor are temporarily discharged before the first period elapses and the second period elapses after the first capacitor and the second capacitor have started the charge accumulation, and thereafter, the accumulation of the charges is resumed, and the fourth storage unit stores a voltage corresponding to accumulated charges after the first capacitor and the second capacitor resume the charge accumulation in the one frame period.

Aspects of the present disclosure are not limited to the above-described respective embodiments, but include various modifications that can be conceived by those skilled in the art, and effects of the present disclosure are not limited to the above-described contents. That is, various additions, changes, and partial deletions can be made within a scope not departing from a conceptual idea and a spirit of the present disclosure derived from the contents defined in the claims and equivalents thereof.

REFERENCE SIGNS LIST

1 Imaging device
1a Pixel array unit
1b Peripheral circuit unit
2 Pixel circuit
4 Scanning line drive circuit
5 Dummy source follower circuit (DSF circuit)
6 Sample and hold circuit (S/H circuit)
7 Analog-to-digital conversion circuit (ADC)
8 Logic circuit
9 Interface circuit (IF circuit)
10 Ground layer
11 First substrate
12 Second substrate
13 Photoelectric conversion region (photodiode)
14 Cathode
15 Anode
16 X-ray shielding plate
17 Wiring layer
18 Peripheral circuit
19 Guard ring
21 Conversion unit
22 Voltage buffer
23 First storage unit
24 Second storage unit
25 Current source
26 First voltage limiter
27 Third Storage unit
28 Fourth storage unit
29 First system unit
30 Second system unit
31 First reset circuit
32 Fifth storage unit
33 First transfer circuit
34 Sixth storage unit
35 Second transfer circuit
41 Comparator
42 Ramp wave selector
43 Counter
44 First multiplexer
Determination circuit
46 First holding circuit
47 Second holding circuit
48 Second multiplexer
49 HG/LG discriminator
51 Second voltage limiter
52 Second reset circuit
53 Gain switch
C0 First capacitor
C1 Second capacitor
C2 Third capacitor

The invention claimed is:

1. An imaging device comprising:
a conversion circuit that converts an incident electromagnetic wave into a charge;
a first capacitor that accumulates charge when a voltage corresponding to the charge is equal to or lower than a predetermined threshold;
a second capacitor that accumulates charge when the voltage exceeds the threshold;
a voltage conversion circuit that converts the charges accumulated in the first capacitor and the second capacitor into voltages;
a first storage circuit that stores a voltage corresponding to the accumulated charge in the first capacitor after a lapse of a first period since the first capacitor has started accumulating the charge;
a second storage circuit that stores a voltage corresponding to the accumulated charges in the first capacitor and the second capacitor after a lapse of a second period longer than the first period since the first capacitor has started accumulating the charge;
a first reset circuit that discharges the accumulated charges in the first capacitor and the second capacitor for initialization;
a third storage circuit that stores an initialization voltage when the first capacitor and the second capacitor are initialized; and
a fourth storage circuit that stores a voltage of a path connected to the first reset circuit when the initialization by the first reset circuit is released.

2. The imaging device according to claim 1, further comprising a first transfer circuit that outputs a differential voltage between the voltage stored in the second storage circuit and the voltage stored in the third storage circuit to a signal line every frame period.

3. The imaging device according to claim 1, further comprising a second transfer circuit that outputs a differential voltage between the voltage stored in the first storage circuit and the voltage stored in the fourth storage circuit to a signal line every frame period.

4. The imaging device according to claim 1, further comprising a first voltage limiter that blocks charge accumulation of the second capacitor in a case where the voltage corresponding to the charge is equal to or lower than the threshold, and accumulates the charge in the second capacitor in a case where the voltage exceeds the threshold.

5. The imaging device according to claim 1, further comprising a mode selection circuit that selects whether to store a voltage corresponding to the accumulated charge of one of the first capacitor and the second capacitor in the second storage circuit or to store a voltage corresponding to the accumulated charges of the first capacitor and the second capacitor in the second storage circuit.

6. The imaging device according to claim 1, further comprising:
a sample and hold circuit that samples and holds a voltage of a signal line that sequentially transfers the voltages stored in the first storage circuit and the second storage circuit at a predetermined cycle; and an AD converter that converts the voltage sampled and held by the sample and hold circuit into a digital signal.

7. The imaging device according to claim 6, further comprising a plurality of pixel circuits connected to the signal line, wherein each of the pixel circuits includes the conversion circuit, the first capacitor, the second capacitor, the first storage circuit, and the second storage circuit, and the sample and hold circuit sequentially holds voltages output from the plurality of pixel circuits in one frame period.

8. An imaging device comprising:

a conversion circuit that converts an incident electromagnetic wave into a charge;

a first capacitor that accumulates charge when a voltage corresponding to the charge is equal to or lower than a predetermined threshold;

a second capacitor that accumulates charge when the voltage exceeds the threshold;

a voltage conversion circuit that converts the charges accumulated in the first capacitor and the second capacitor into voltages;

a first storage circuit that stores a voltage corresponding to the accumulated charge in the first capacitor after a lapse of a first period since the first capacitor has started accumulating the charge;

a second storage circuit that stores a voltage corresponding to the accumulated charges in the first capacitor and the second capacitor after a lapse of a second period longer than the first period since the first capacitor has started accumulating the charge;

a sample and hold circuit that samples and holds a voltage of a signal line that sequentially transfers the voltages stored in the first storage circuit and the second storage circuit at a predetermined cycle;

an AD converter that converts the voltage sampled and held by the sample and hold circuit into a digital signal;

a first holding circuit that holds one voltage out of the voltage stored in the first storage circuit and the voltage stored in the second storage circuit; and a second holding circuit that holds another voltage out of the voltage stored in the first storage circuit and the voltage stored in the second storage circuit.

9. The imaging device according to claim 8, further comprising:

a determination circuit that determines whether or not the accumulated charge in the first capacitor is saturated on a basis of digital signals held in the first holding circuit and the second holding circuit; and a selection circuit that selects and outputs the digital signal held in the first holding circuit or the second holding circuit on a basis of a determination result of the determination circuit.

10. An imaging device comprising:

a conversion circuit that converts an incident electromagnetic wave into a charge;

a first capacitor that accumulates charge when a voltage corresponding to the charge is equal to or lower than a predetermined threshold;

a second capacitor that accumulates charge when the voltage exceeds the threshold;

a voltage conversion circuit that converts the charges accumulated in the first capacitor and the second capacitor into voltages;

a first storage circuit that stores a voltage corresponding to the accumulated charge in the first capacitor after a lapse of a first period since the first capacitor has started accumulating the charge;

a second storage circuit that stores a voltage corresponding to the accumulated charges in the first capacitor and the second capacitor after a lapse of a second period longer than the first period since the first capacitor has started accumulating the charge;

a sample and hold circuit that samples and holds a voltage of a signal line that sequentially transfers the voltages stored in the first storage circuit and the second storage circuit at a predetermined cycle;

an AD converter that converts the voltage sampled and held by the sample and hold circuit into a digital signal, wherein the AD converter includes:

a ramp wave selector that selects a first ramp wave voltage when the voltage held in the sample and hold circuit is equal to or higher than a predetermined reference voltage, and selects a second ramp wave voltage having a smaller change width of a voltage amplitude and a lower voltage change rate over time than the first ramp wave voltage when the voltage held in the sample and hold circuit is lower than the reference voltage;

a comparison circuit that compares the voltage held in the sample and hold circuit with the first ramp wave voltage or the second ramp wave voltage; and a counter that generates the digital signal on the basis of a comparison result of the comparison circuit.

11. An imaging device comprising:

a conversion circuit that converts an incident electromagnetic wave into a charge;

a first capacitor that accumulates charge when a voltage corresponding to the charge is equal to or lower than a predetermined threshold;

a second capacitor that accumulates charge when the voltage exceeds the threshold;

a voltage conversion circuit that converts the charges accumulated in the first capacitor and the second capacitor into voltages;

a first storage circuit that stores a voltage corresponding to the accumulated charge in the first capacitor after a lapse of a first period since the first capacitor has started accumulating the charge;

a second storage circuit that stores a voltage corresponding to the accumulated charges in the first capacitor and the second capacitor after a lapse of a second period longer than the first period since the first capacitor has started accumulating the charge; and a mode selection circuit configured for selecting a predetermined mode for expanding a dynamic range, wherein, when the predetermined mode is selected, in one frame period out of two successive frame periods, a length of the first period is shortened as compared with a length of the first period in another frame period, and an amount of the accumulated charges of the first capacitor and the second capacitor stored in the second storage circuit is limited.

12. The imaging device according to claim 11, wherein in the one frame period, the accumulated charges in the first capacitor and the second capacitor are temporarily discharged before the first period elapses and the second period elapses after the first capacitor and the second capacitor have started charge accumulation, and thereafter, the charge accumulation is resumed, and the second storage circuit stores a voltage corresponding to accumulated charges after the first capacitor and the second capacitor resume the charge accumulation in the one frame period.

13. An imaging device comprising:
a conversion circuit that converts an incident electromagnetic wave into a charge;
a first capacitor that accumulates charge when a voltage corresponding to the charge is equal to or lower than a predetermined threshold;
a second capacitor that accumulates charge when the voltage exceeds the threshold;
a voltage conversion circuit that converts the charges accumulated in the first capacitor and the second capacitor into voltages;
a first storage circuit that stores a voltage corresponding to the accumulated charge in the first capacitor after a lapse of a first period since the first capacitor has started accumulating the charge;
a second storage circuit that stores a voltage corresponding to the accumulated charges in the first capacitor and the second capacitor after a lapse of a second period longer than the first period since the first capacitor has started accumulating the charge;
a third storage circuit that stores a voltage corresponding to the accumulated charge in the first capacitor after a lapse of the first period since the first capacitor has started accumulating the charge;
a fourth storage circuit that stores a voltage corresponding to the accumulated charges in the first capacitor and the second capacitor after the lapse of the second period since the first capacitor has started accumulating the charge,
wherein voltages stored in the third storage circuit and the fourth storage circuit in a frame period immediately before a predetermined frame period are output to a signal line while storing corresponding voltages respectively in the first storage circuit and the second storage circuit in the predetermined frame period, and
the voltages stored in the first storage circuit and the second storage circuit in the predetermined frame period are output to the signal line while storing corresponding voltages in the third storage circuit and the fourth storage circuit in a frame period immediately after the predetermined frame period; and
a mode selection circuit configured for selecting a predetermined mode for expanding a dynamic range,
wherein, when the predetermined mode is selected, in one frame period out of two successive frame periods, a length of the first period is shortened as compared with a length of the first period in another frame period, and an amount of the accumulated charges of the first capacitor and the second capacitor stored in the second storage circuit and the fourth storage circuit is limited.

14. The imaging device according to claim 13, wherein in the one frame period, the accumulated charges in the first capacitor and the second capacitor are temporarily discharged before the first period elapses and the second period elapses after the first capacitor and the second capacitor have started charge accumulation, and thereafter, the charge accumulation is resumed, and
the fourth storage circuit stores a voltage corresponding to accumulated charges after the first capacitor and the second capacitor resume the charge accumulation in the one frame period.

* * * * *